(12) United States Patent
Ahn et al.

(10) Patent No.: US 8,614,113 B2
(45) Date of Patent: Dec. 24, 2013

(54) IMAGE SENSOR AND METHOD OF FABRICATING THE SAME

(75) Inventors: Yu-Jin Ahn, Seongnam-si (KR);
Duck-Hyung Lee, Seongnam-si (KR);
Jong-Cheol Shin, Hwaseong-si (KR);
Chang-Rok Moon, Seoul (KR);
Sang-Jun Choi, Yongin-si (KR);
Eun-Kyung Park, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 26 days.

(21) Appl. No.: 13/239,457

(22) Filed: Sep. 22, 2011

(65) Prior Publication Data
US 2012/0077301 A1    Mar. 29, 2012

(30) Foreign Application Priority Data

Sep. 29, 2010   (KR) .......................... 10-2010-0094615

(51) Int. Cl.
*H01L 21/00*    (2006.01)
*H01L 27/146*   (2006.01)

(52) U.S. Cl.
USPC .......................................... 438/73; 257/446

(58) Field of Classification Search
USPC ........................................ 257/446; 438/73
See application file for complete search history.

(56) References Cited

U.S. PATENT DOCUMENTS

| | | | |
|---|---|---|---|
| 7,736,992 B2 * | 6/2010 | Cole et al. ...................... | 438/436 |
| 2004/0253761 A1 * | 12/2004 | Rhodes et al. .................. | 438/84 |
| 2008/0012088 A1 | 1/2008 | Yamaguchi et al. | |
| 2010/0187581 A1 * | 7/2010 | Shinohara et al. ............ | 257/292 |
| 2010/0203670 A1 * | 8/2010 | Ohtani et al. .................... | 438/98 |
| 2012/0043589 A1 * | 2/2012 | Nozaki et al. .................. | 257/225 |
| 2012/0052652 A1 * | 3/2012 | Fu et al. ........................ | 438/423 |

FOREIGN PATENT DOCUMENTS

| | | |
|---|---|---|
| JP | 2008-021875 | 1/2008 |
| KR | 1020040065335 | 7/2004 |
| KR | 1020080014301 A | 2/2008 |

* cited by examiner

*Primary Examiner* — Zandra Smith
*Assistant Examiner* — Jamie C Niesz
(74) *Attorney, Agent, or Firm* — Volentine & Whitt, PLLC

(57) ABSTRACT

An image sensor and a method for fabricating the image sensor are provided. The method for fabricating the image sensor includes forming a first insulating layer on a semiconductor epitaxial layer having multiple pixel regions; patterning a portion of the semiconductor epitaxial layer and the first insulating layer in a boundary region between the pixel regions to form a trench; forming a buried insulating layer on the first insulating layer, filling the trench, the buried insulating layer having a planar top surface; forming a second insulating layer on the buried insulating layer; forming a first mask pattern on the second insulating layer, the first mask pattern defining an opening overlapping the trench; and performing an ion implantation process using the first mask pattern as an ion implantation mask to form a first type potential barrier region in a bottom of the trench.

14 Claims, 18 Drawing Sheets

IMAGE SENSOR AND METHOD OF FABRICATING THE SAME

CROSS-REFERENCE TO RELATED APPLICATIONS

A claim of priority under 35 U.S.C. §119 is made to Korean Patent Application No. 10-2010-0094615, filed on Sep. 29, 2010, in the Korean Intellectual Property Office, the entire contents of which are hereby incorporated by reference.

BACKGROUND

The present disclosure herein relates to image sensors and methods for fabricating the same.

Image sensors are semiconductor devices capable of converting electric signals into optical images. Image sensors may be classified into various types, including charge coupled device (CCD) type and complementary metal oxide semiconductor (CMOS) type. A CMOS image sensor (CIS) includes pixels arranged in two dimensions. Each of the pixels includes a photodiode (PD), which converts incident light into an electric signal.

As semiconductor devices become more highly integrated, image sensors likewise include large scale integration. The corresponding pixels are therefore scaled down, such that cross talk may occur between pixels and more noise may be generated.

SUMMARY

Embodiments of the inventive concept provide highly integrated image sensors in which cross talk is minimized or prevented. Embodiments of the inventive concept also provide methods for fabricating highly integrated image sensors in which a device isolation region is not damaged cross talk occurrence is minimized or prevented.

According to an aspect of the inventive concept, a method is provided for fabricating an image sensor. The method includes forming a first insulating layer on a semiconductor epitaxial layer having multiple pixel regions; patterning a portion of the semiconductor epitaxial layer and the first insulating layer in a boundary region between the pixel regions to form a trench; forming a buried insulating layer on the first insulating layer, filling the trench, the buried insulating layer having a planar top surface; forming a second insulating layer on the buried insulating layer; forming a first mask pattern on the second insulating layer, the first mask pattern defining an opening overlapping the trench; and performing an ion implantation process using the first mask pattern as an ion implantation mask to form a first type potential barrier region in a bottom of the trench.

In various embodiments, the first insulating layer and the second insulating layer may include the same material and have the same thickness. Also, an ion implantation angle of the first ion implantation process may be about zero degrees.

In various embodiments, the method may further include widening the opening in the first mask pattern; and performing a second ion implantation process using the first mask with the widened opening as a second ion implantation mask to form a first type side potential barrier region on the semiconductor epitaxial layer adjacent to a sidewall of the trench.

In various embodiments, the method may further include removing the first mask pattern; removing the second insulating layer; and etching the buried insulating layer to expose a top surface of the first insulating layer and to form a device isolation layer filling the trench.

In various embodiments, the method may further include forming a second mask pattern over the device isolation layer, exposing each of the pixel regions; and performing a third ion implantation process using the second mask pattern as a third ion implantation mask to form a second type well in the semiconductor epitaxial layer. The second type well may be formed to the same depth as the first type potential barrier region.

In various embodiments, the method may further include removing a lower portion of the semiconductor epitaxial layer. A depth of the first type potential barrier region may correspond to a thickness of the semiconductor epitaxial layer remaining after removing the lower portion of the semiconductor epitaxial layer.

In various embodiments, the first mask pattern may be at least one of a silicon oxide layer and a silicon nitride layer.

According to another aspect of the inventive concept, an image sensor includes a semiconductor epitaxial layer having multiple pixel regions, a device isolation layer in the semiconductor epitaxial layer separating the pixel regions, a first type potential barrier region disposed under the device isolation layer and extending to a bottom surface of the semiconductor epitaxial layer, and a first type side potential barrier region disposed to be adjacent to the sidewall of the device isolation layer and connected to the first type potential barrier region. Further, a second type well is disposed in the semiconductor epitaxial layer in each pixel region, and a photoelectric conversion element is disposed on the second type well in the semiconductor epitaxial layer in each pixel region.

In various embodiments, the second type well may extend to the bottom surface of the semiconductor epitaxial layer.

In various embodiments, the image sensor may further include a color filter and a micro lens disposed on the bottom surface of the semiconductor epitaxial layer.

In various embodiments, the photoelectric conversion element may further include a first type impurity implantation region and a second type impurity implantation region. An impurity concentration may be higher in the second type impurity implantation region than in the second type well.

According to another aspect of the inventive concept, a method is provided for fabricating an image sensor. The method includes forming a trench in a semiconductor epitaxial layer in a boundary region between pixel regions in the semiconductor epitaxial layer; filling the trench with a buried insulating layer and planarizing a top surface of the buried insulating layer; forming an insulating layer on the buried insulating layer; forming a first mask pattern on the insulating layer, the first mask pattern defining an opening overlapping the trench; and performing a first ion implantation process using the first mask pattern as a first ion implantation mask to form a first type potential barrier region in a bottom of the trench.

BRIEF DESCRIPTION OF THE DRAWINGS

Illustrative embodiments of the inventive concept will be more clearly understood from the following detailed description taken in conjunction with the accompanying drawings, in which.

DETAILED DESCRIPTION OF THE EMBODIMENTS

Figure 1:
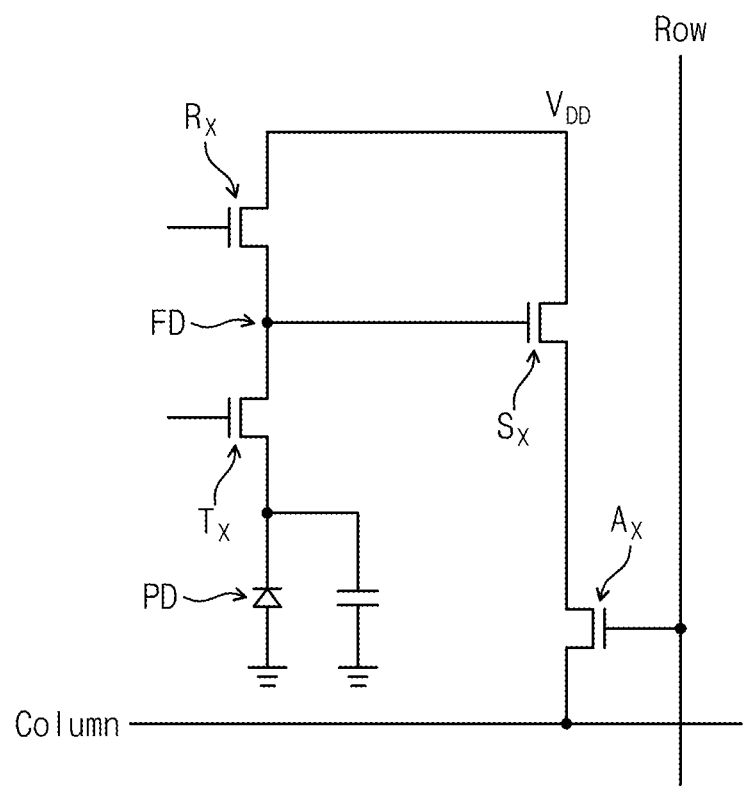
FIG. 1 is an equivalent circuit diagram of an image sensor, according to an embodiment of the inventive concept.

Embodiments of the inventive concept will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated.

FIG. 1 is an equivalent circuit diagram of an image sensor, according to an embodiment of the inventive concept.

Referring to FIG. 1, a unit pixel of an image sensor includes a photoelectric conversion region PD, a transfer transistor Tx, a selection transistor Sx, a reset transistor Rx and an access transistor Ax. Multiple photoelectric conversion elements may be sequentially stacked in the photoelectric conversion region PD. The photoelectric conversion element may be a photo diode, which includes an n-type impurity region and a p-type impurity region, for example. A transfer gate of the transfer transistor Tx may extend into an semiconductor epitaxial layer. The transfer transistor Tx may have a drain connected to a floating diffusion region FD. The floating diffusion region FD may also be connected to a source of the reset transistor Rx and to a selection gate of the selection transistor Sx. The selection transistor Sx and the reset transistor Rx are connected in series with each other, and the selection transistor Sx is connected with the access transistor Ax. In various configurations, adjacent pixels may share the reset transistor Rx, the selection transistor Sx and/or the access transistor Ax, thus improving the degree of integration.

Operation of the image sensor is described with reference to FIG. 1. While incident light is shut out, power supply voltage $V_{DD}$ is applied to drains of the reset transistor Rx and the selection transistor Sx to discharge electrons remaining in the floating diffusion region FD. The reset transistor Rx is then turned off, and light is allowed to be incident onto the photoelectric conversion region PD, such that electron-hole pairs are generated in the photoelectric conversion region PD. Holes are accumulated in the p-type impurity region and electrons are accumulated in the n-type impurity region. The transfer transistor Tx is turned on, and charges, such as holes and electrons, are accumulated in the floating diffusion region FD. A gate bias of the selection transistor Sx is changed in proportion to accumulated charge quantity, such that the source potential of the selection transistor Sx is changed. The access transistor Ax is then turned on, such that a signal caused by charges is read through a column line.

As image sensors become more highly integrated, the photoelectric conversion regions PD become smaller, which reduces light receiving capability. According to embodiments of the inventive concept, a potential barrier region is disposed under the device isolation layer, which separates pixels to reduce or prevent crosstalk between pixels.

Figure 2:
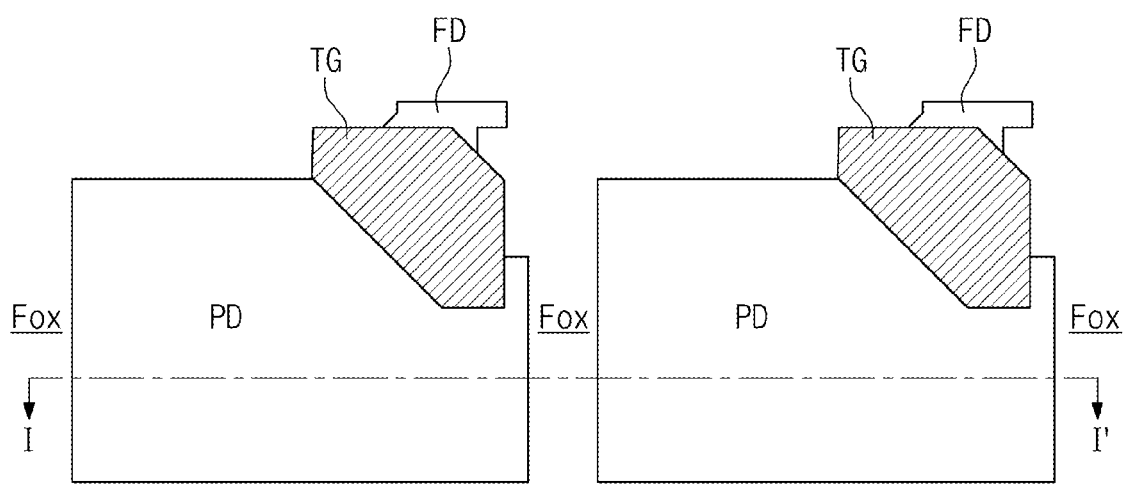
FIG. 2 is a plan view of an image sensor, according to an embodiment of the inventive concept.
Figure 3:
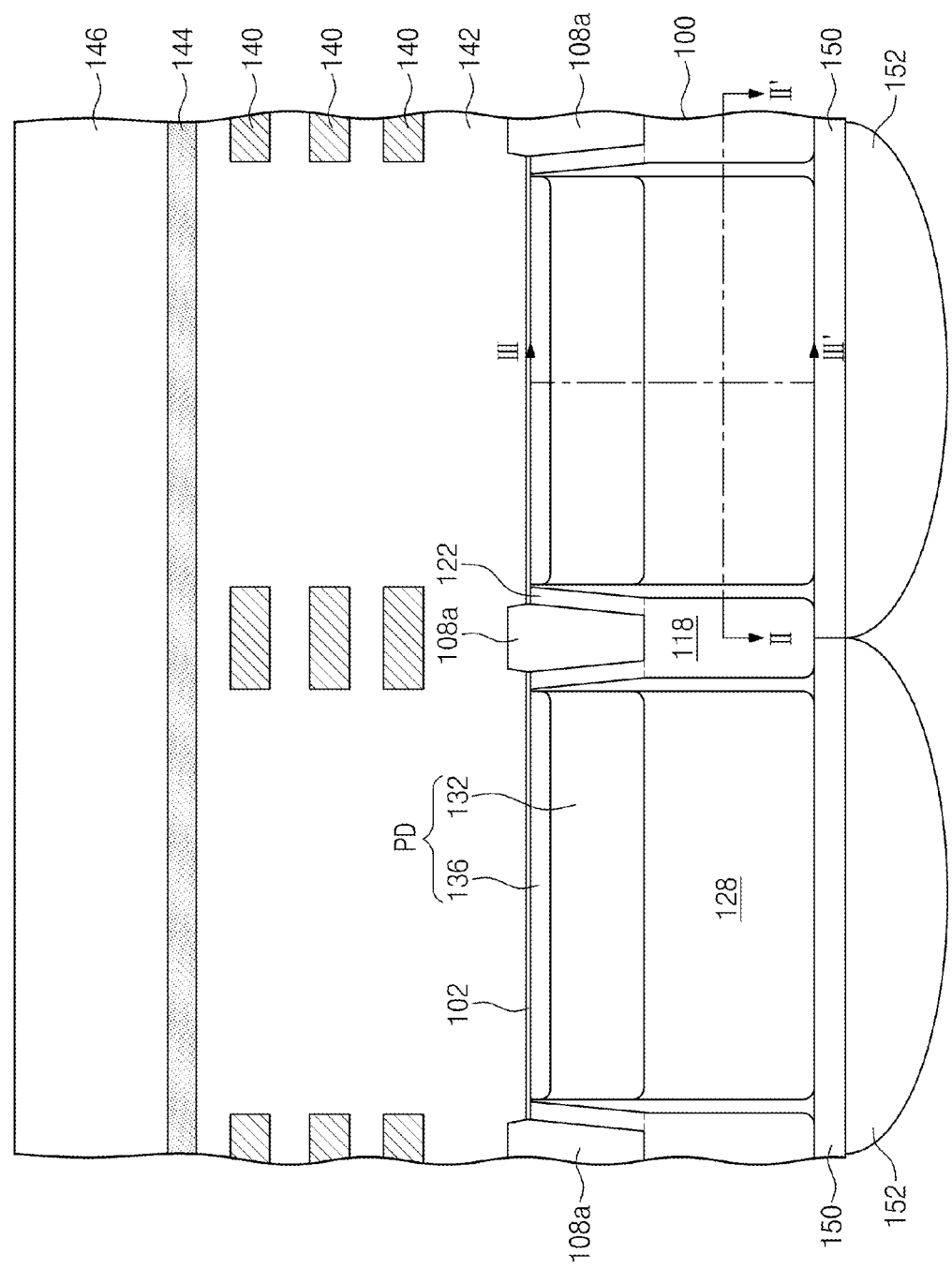
FIG. 3 is a cross-sectional view taken along line I-I' of FIG. 2, according to an embodiment of the inventive concept.

FIG. 2 is a plan view of an image sensor, according to an embodiment of the inventive concept, and FIG. 3 is a cross-sectional view taken along line I-I' of FIG. 2, according to an embodiment of the inventive concept.

Referring to FIGS. 2 and 3, device isolation layer 108a is disposed in semiconductor epitaxial layer 100 in a boundary region between separate pixel regions. Each pixel region includes a photoelectric conversion region PD, a transfer transistor Tx including a transfer gate TG adjacent to the photoelectric conversion region PD, and a floating diffusion region FD. Although not shown in FIG. 2, the selection transistor Sx, the reset transistor Rx and the access transistor Ax are included, as well. A first type potential barrier region 118 is disposed under the device isolation layer 108a, and extends to a bottom surface of the semiconductor epitaxial layer 100. A first type side potential barrier region 122 is disposed in the semiconductor epitaxial layer 100 adjacent to a sidewall of the device isolation layer 108a. The device isolation layer 108a and at least one of the first type potential barrier region 118 and the first type side potential barrier region 122 provide a device isolation region, indicated as Fox in FIG. 2.

The photoelectric conversion region PD corresponding to a pixel region is disposed in the semiconductor epitaxial layer 100 between device isolation layers 108a, and includes a first type impurity implantation region 136 adjacent to a top surface of the semiconductor epitaxial layer 100 and a second type impurity implantation region 132 beneath the first type impurity implantation region 136. A second type well 128 is disposed beneath the second type impurity implantation region 132 and extends to the bottom surface of the semiconductor epitaxial layer 100. The first type may be p-type and the second type may be n-type, for example. Also, the second type impurity implantation region 132 may have impurity concentration higher than that of the second type well 128.

A buffer layer 102 is disposed on the top surface of the semiconductor epitaxial layer 100. Interconnection layers 140 and an interlayer insulating layer 142 are disposed on the buffer layer 102. A passivation layer 144 and a substrate 146 may be are sequentially disposed on the interlayer insulating layer 142. A color filter 150 and a micro lens 152 may be disposed on the bottom surface of the semiconductor epitaxial layer 100.

Figure 4A:
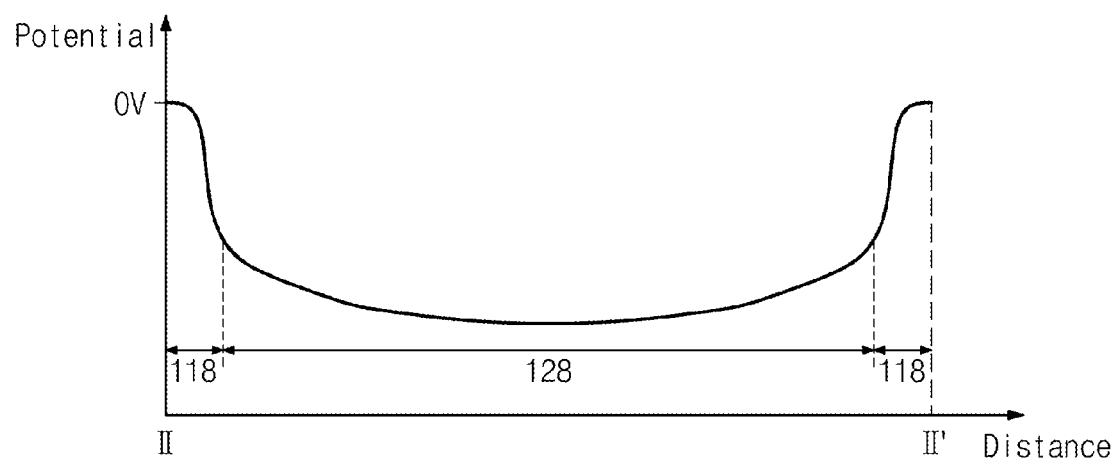
FIG. 4A is a graph illustrating potential distribution taken along line II-II' of FIG. 3, according to an embodiment of the inventive concept.
Figure 4B:
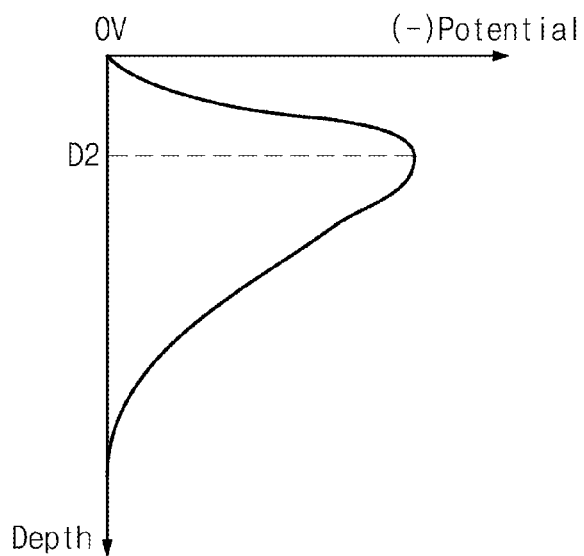
FIG. 4B is a graph illustrating potential distribution taken along line III-III' of FIG. 3, according to an embodiment of the inventive concept.

FIG. 4A is a graph illustrating potential distribution taken along line II-II' of FIG. 3, and FIG. 4B is a graph illustrating potential distribution taken along line III-III' of FIG. 3, according to an embodiment of the inventive concept.

Referring to FIGS. 4A and 4B, electric potential is lowest at second depth D2, which corresponds to a central depth of the second impurity implantation region 132. As shown in FIG. 4A, the electric potential is higher in the first type potential barrier region 118 than in the second type well 128. Therefore, electrons generated by light incident on the semiconductor epitaxial layer 100 move to the photoelectric conversion region PD, rather than diffuse into adjacent pixels due to the high potential barrier of the first type potential barrier region 118. As a result, the crosstalk between pixels is reduced and/or prevented and sensitivity is improved.

The first type potential barrier region 118 extends to the bottom surface of the semiconductor epitaxial layer 100 to prevent the crosstalk between the pixels. The second type well 128 extends from the bottom surface of the second type impurity implantation region 132 to the bottom surface of the semiconductor epitaxial layer 100, thereby increasing light receiving capability and also improving photo sensitivity.

FIGS. 5 through 17 are cross-sectional views sequentially illustrating a method for fabricating an image sensor with the cross-sectional view of FIG. 3, according to an embodiment of the inventive concept.

Figure 5:
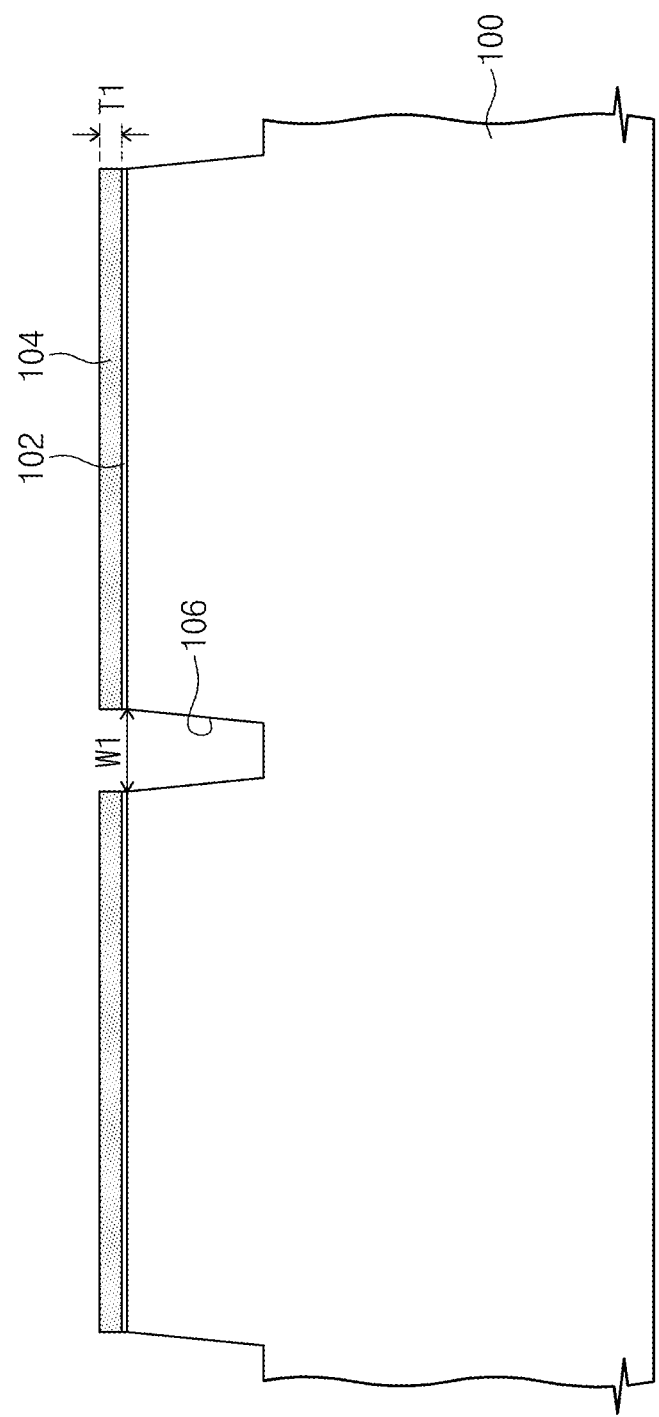
FIGS. 5 through 17 are cross-sectional views sequentially illustrating a method for fabricating an image sensor from the cross-sectional view of FIG. 3, according to an embodiment of the inventive concept.

Referring to FIG. 5, the semiconductor epitaxial layer 100 is prepared. The semiconductor epitaxial layer 100 is on a semiconductor substrate (not shown). The semiconductor epitaxial layer 100 may be doped with first type impurities, for example. The buffer layer 102 and a first insulating layer 104 are formed sequentially on the semiconductor epitaxial layer 100. The buffer layer 102 may be a silicon oxide layer, for example, formed by a thermal oxidation process. The first insulating layer 104 may be a silicon nitride layer, for example, and is formed to have a first thickness T1. The first insulating layer 104, the buffer layer 102 and a portion of the semiconductor epitaxial layer 100 are patterned to form a trench 106 in a boundary region between pixels. The first trench 106 may be formed to have a first width W1, as shown.

Figure 6:
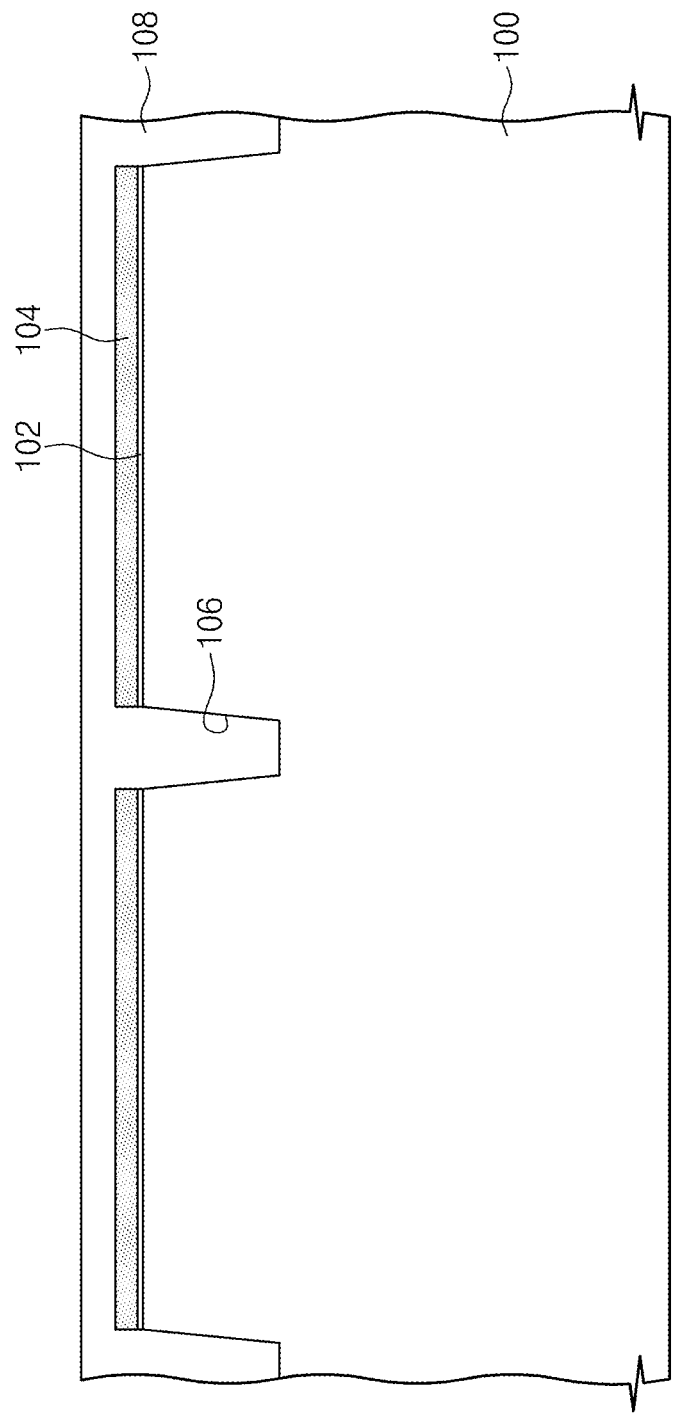

Referring to FIG. 6, a buried insulating layer 108 is formed on the semiconductor epitaxial layer 100 and the trench 106, filling the trench 106. The buried insulating layer 108 may be formed of a silicon oxide layer formed in a high density plasma deposition process, for example. After forming the buried insulating layer 108, a top surface of the buried insulating layer 108 is planarized, for example, using a Chemical Mechanical Polishing (CMP) process. The planarized buried insulating layer 108 therefore covers the first insulating layer 104 with a predetermined thickness.

Figure 7:
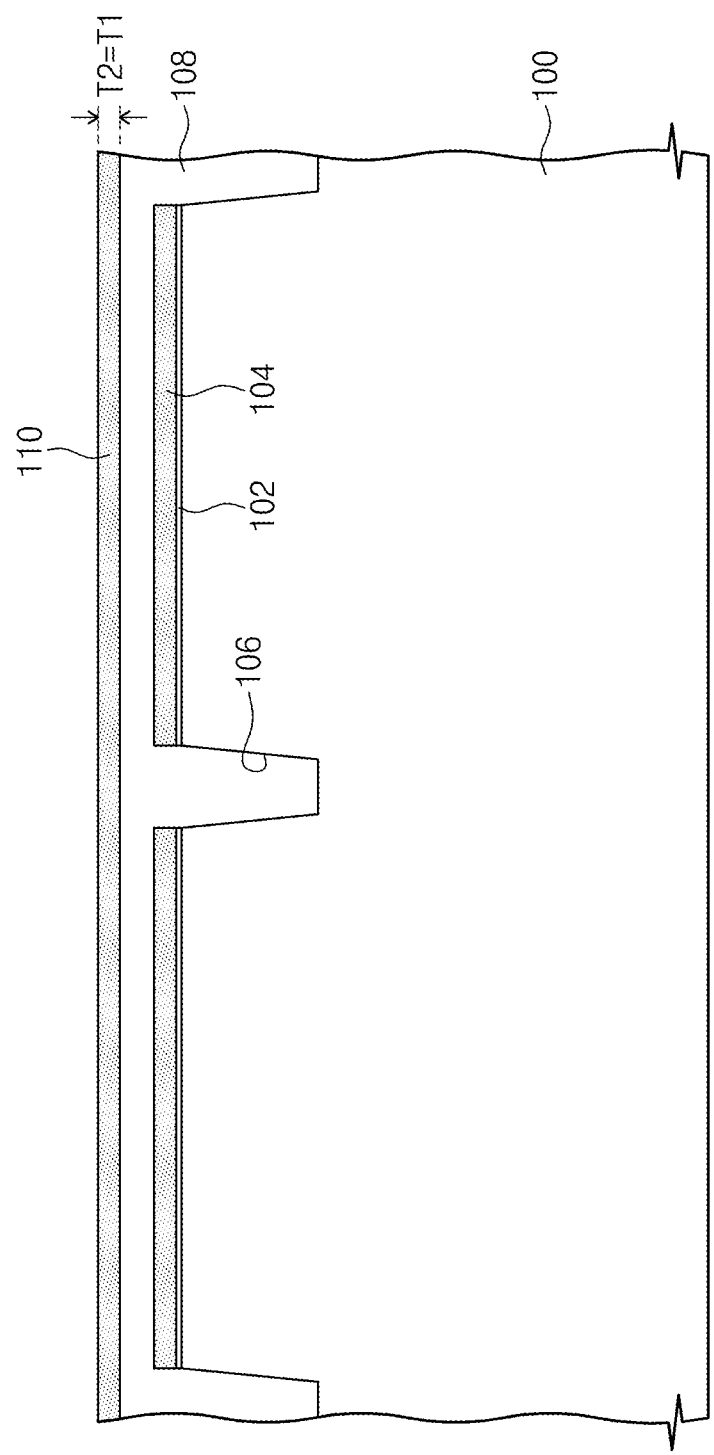

Referring to FIG. 7, a second insulating layer 110 is formed on the buried insulating layer 108. The second insulating layer 110 may be formed at a second thickness T2 using material with etching selectivity to the buried insulating layer 108. The second insulating layer 110 may be formed the same as the first insulating layer 104 to achieve process simplification and convenience. Thus, the second insulating layer 110 may be formed as a silicon nitride layer, for example, and the second thickness T2 may be equal to the first thickness T1.

Figure 8:
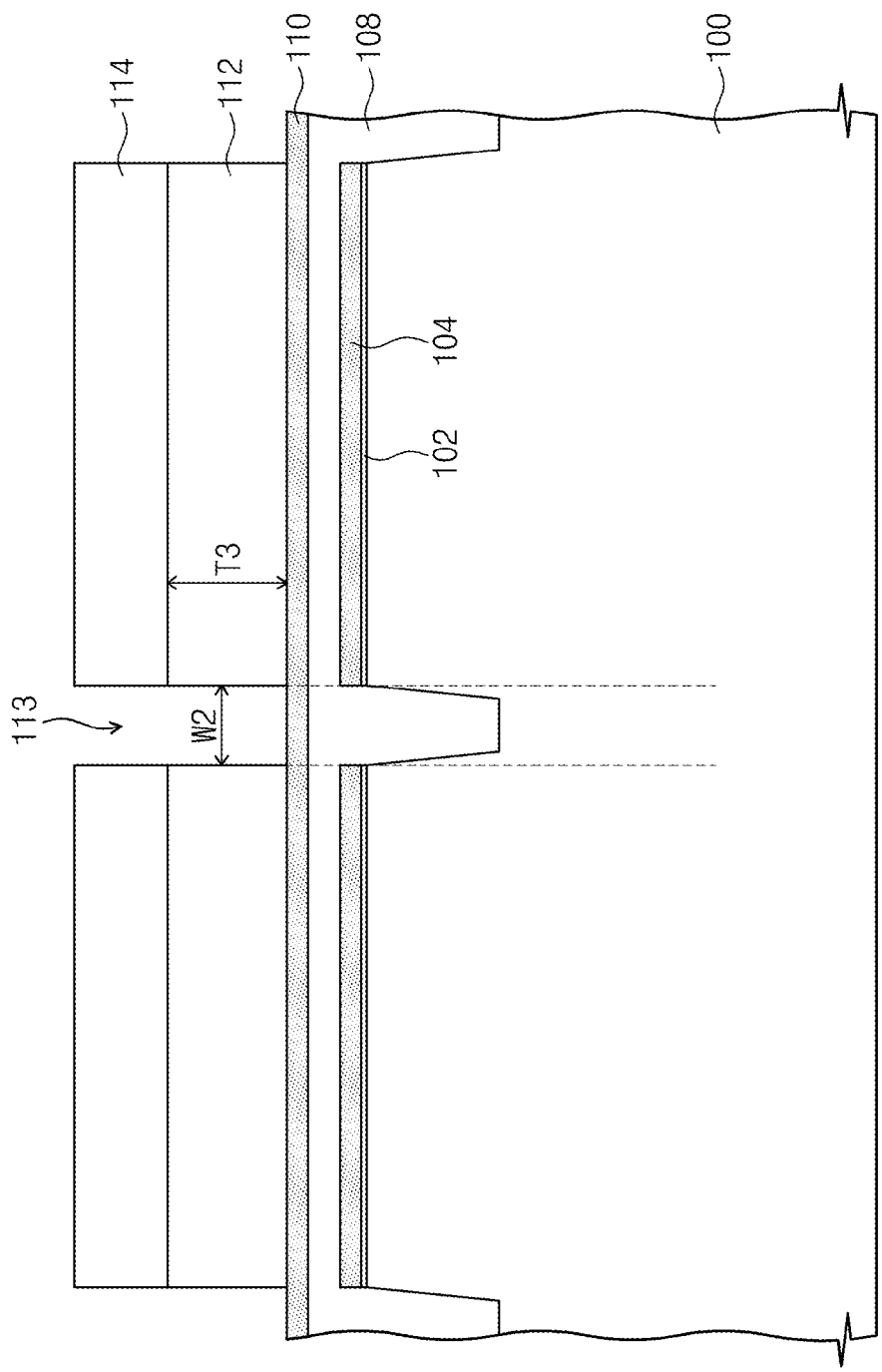

Referring to FIG. 8, a first mask pattern 112 is formed on the second insulating layer 110. The first mask pattern 112 may be used as an ion implantation mask for forming a first type potential barrier region (e.g., first type potential barrier region 118), discussed below. Since the first type potential barrier region is distributed to the bottom surface of the semiconductor epitaxial layer 100, high energy ion implantation process is necessary. To form the first mask pattern 112, a first mask layer is formed on the second insulating layer 110, where the first mask layer may be formed of a silicon oxide layer or a silicon nitride layer, for example, rather than a photoresist layer. The first mask layer may be formed to have a third thickness T3, which is sufficient to act as an ion implantation mask in forming the first type potential barrier region. A photoresist pattern 114 is formed on the first mask layer. The photoresist pattern 114 may be formed to have a thickness sufficient to act as an etch mask for etching the first mask layer.

The first mask layer may then be patterned using the photoresist pattern 114 as an etch mask to form the first mask pattern 112, which has a first opening 113 exposing the second insulating layer 110. The first opening 113 vertically overlaps the trench 106, and has a second width W2 that is substantially the same as the first width W1 of the trench 106. As image sensors become more highly integrated, the first and second widths W1 and W2 become narrower. Because the first mask pattern 112 is formed of a silicon oxide layer rather than a photoresist layer, in the depicted example, the second width W2 may be easily achieved. A silicon oxide layer may have about half the thickness of a photoresist layer for an ion implantation mask with respect to the same ion implantation energy and mean projected range. Therefore, if the first mask pattern 112 were formed of a photoresist layer, the photoresist layer would be formed at about twice the third thickness T3. The thicker photoresist layer would thus limit formation of the first opening 113 having a narrow second width W2 due to resolution. However, when the first mask pattern 112 is formed of a silicon oxide layer, the photoresist pattern 114 may be formed relatively thin, so that it is capable of achieving good resolution, and then the silicon oxide layer may be patterned using the photoresist pattern 114 as an etch mask to form the first mask pattern 112 with the first opening 113.

Figure 9:
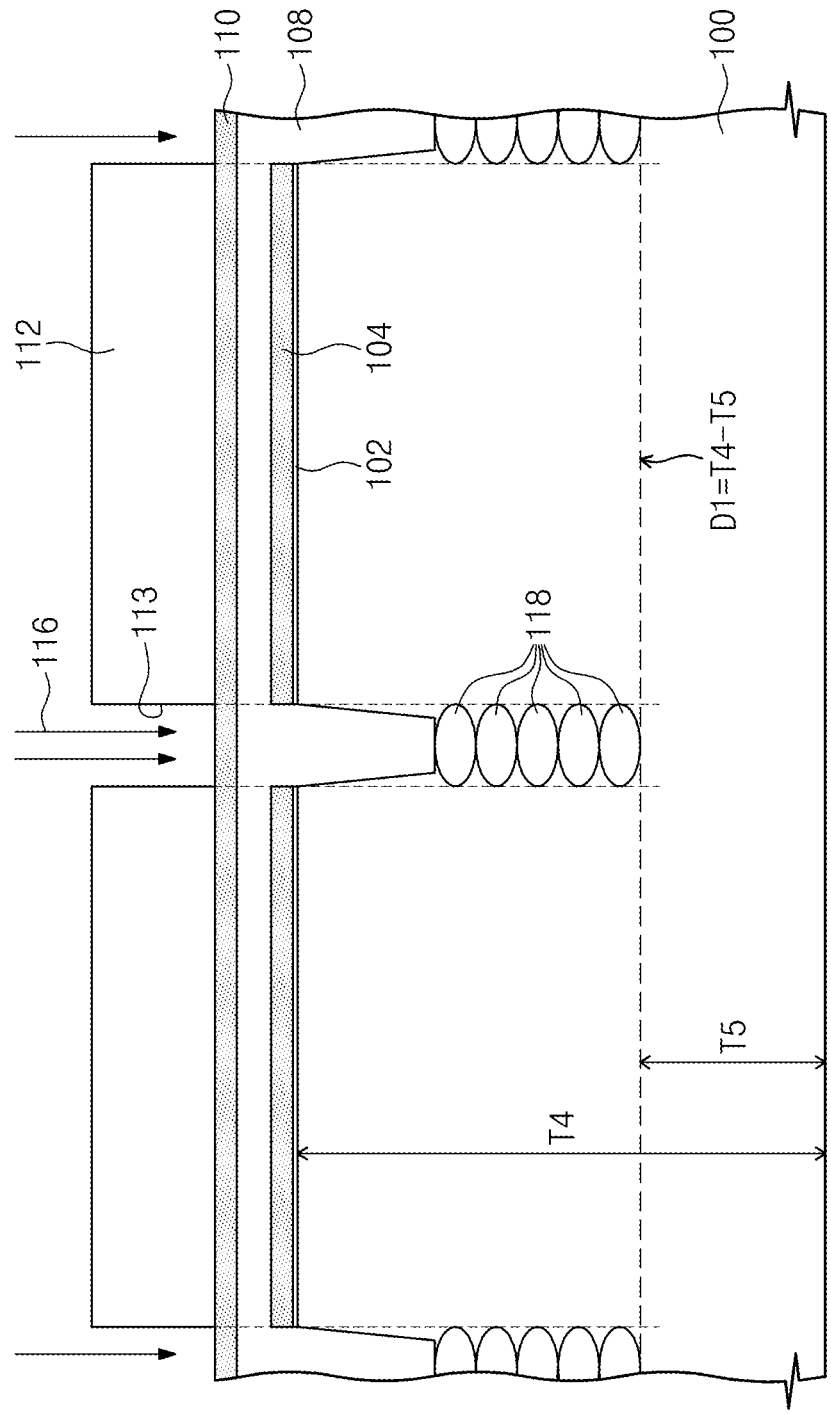

Referring to FIG. 9, the photoresist pattern 114 is removed, for example, using an ashing/strip process. Multiple first ion implantation processes 116 may then be performed using the first mask pattern 112 as an ion implantation mask to form the first type potential barrier region 118 beneath the trench 106. The first ion implantation process 116 is performed multiple times with changing projection range Rp to form the first type potential barrier region 118 from the bottom surface of the trench 106 to a first depth D1 of the semiconductor epitaxial layer 100. The first ion implantation process 116 may be performed by injecting boron with high energy at a zero degree angle, for example. The first depth D1 may be determined by subtracting fifth thickness T5, which is to be removed in a subsequent process, from fourth thickness T4, which is the total thickness of the semiconductor epitaxial layer 100, as shown.

Figure 10:
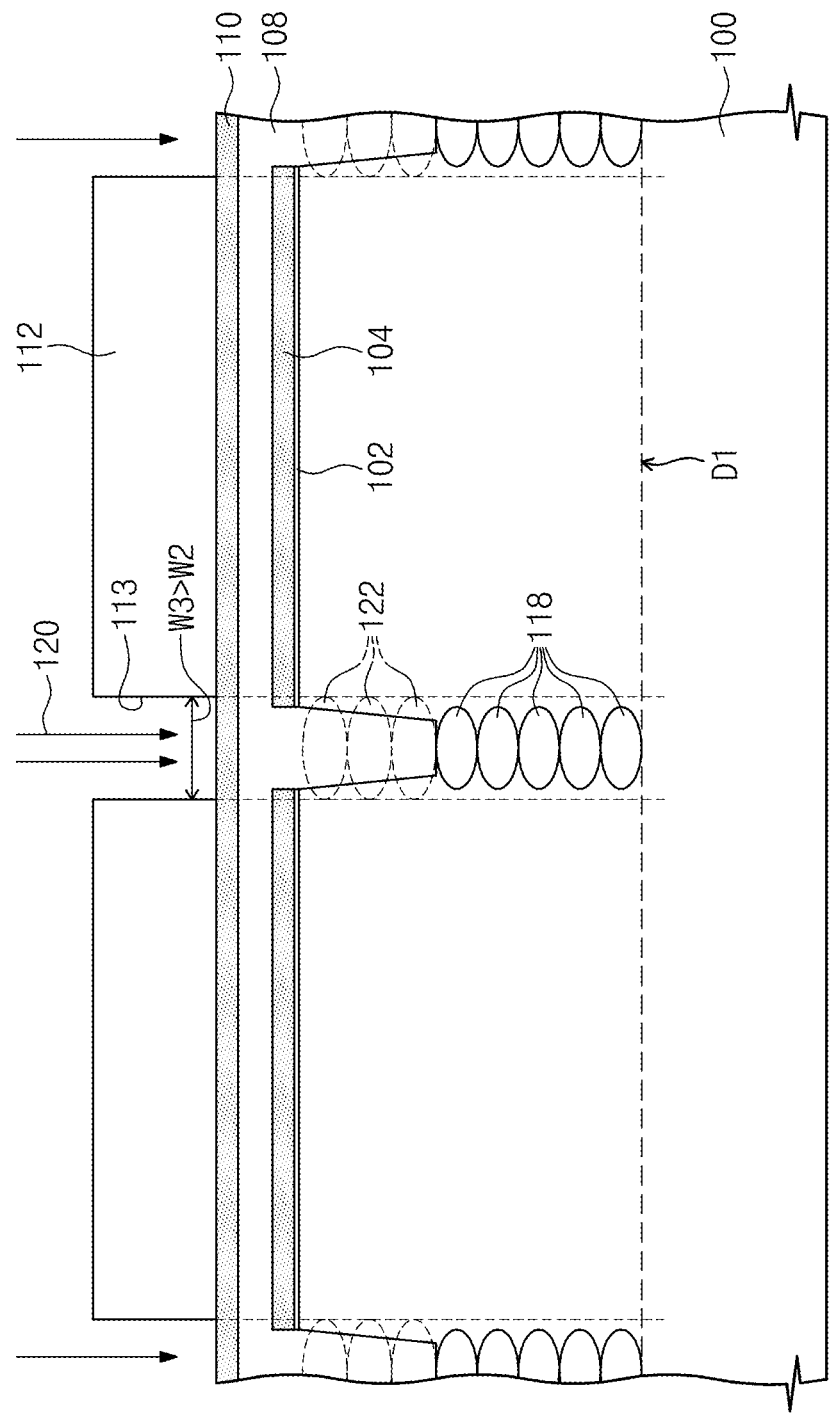

Referring to FIG. 10, a portion of the first mask pattern 112 is removed to widen the opening 113, such that the opening 113 has a third width W3 wider than the second width W2. An isotropic etching process may be performed to remove the portion of the first mask pattern 112. An upper part of the first mask pattern 112 may be also removed in the isotropic etching process. A second ion implantation process 120 is performed using the first mask pattern 112 as an ion implantation mask to form the first type side potential barrier region 122 in the semiconductor epitaxial layer 100 adjacent to the buried insulating layer 108 filling the trench 106. The second ion implantation process 120 may be also be performed by injecting boron at a zero degree angle, for example. The projection range Rp of the second ion implantation process 120 may be lower than that of the first ion implantation process 116, discussed above. The buried insulating layer 108 acts as a buffering layer to prevent/decrease ion channeling and to protect the interface of the semiconductor epitaxial layer 100 from high energy.

Figure 11:
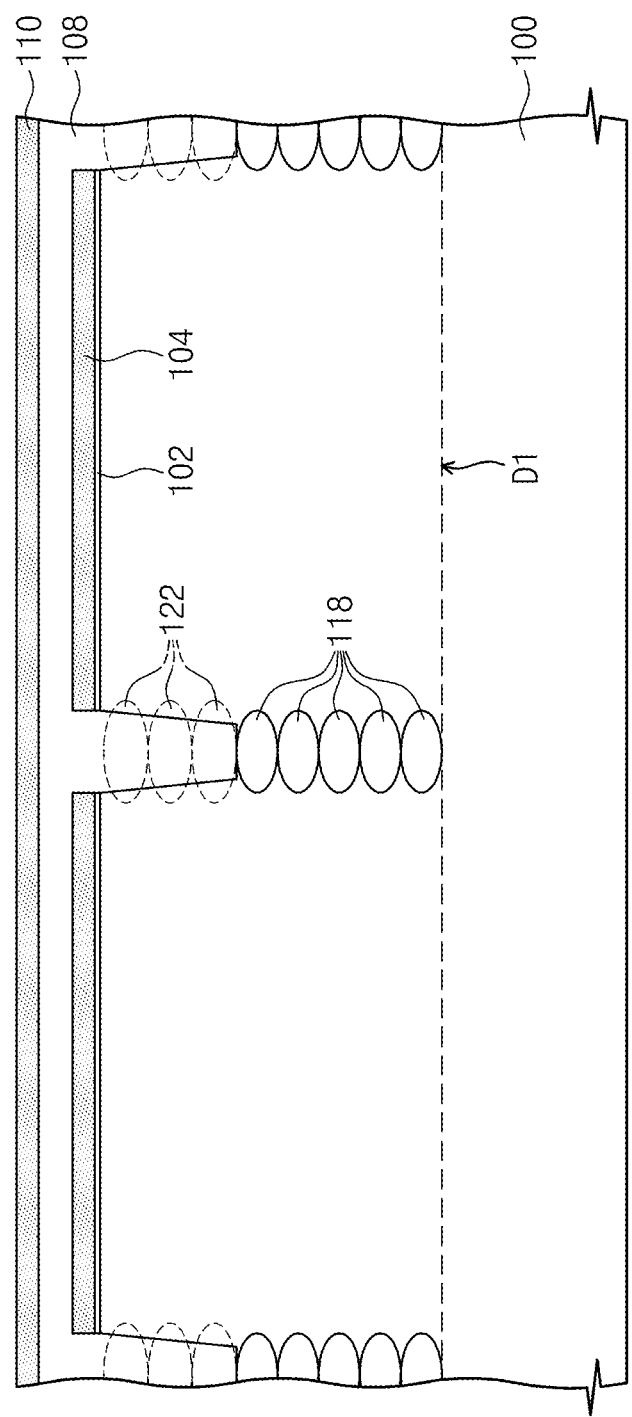

Referring to FIG. 11, the first mask pattern 112 is selectively etched to expose a top surface of the second insulating layer 110. The first mask pattern 112 may be removed by an isotropic etching process, for example. The isotropic etching process may be performed using an etchant for which etch selectivity of the second insulating layer 110 with respect to the first mask pattern 112 is about 400:1. For example, if the first mask pattern 112 is formed of silicon oxide layer and the second insulating layer 110 is formed of a silicon nitride layer, the etchant may be Hydrofluoric acid (HF) or Buffered Oxide etchant (BOE).

Figure 12:
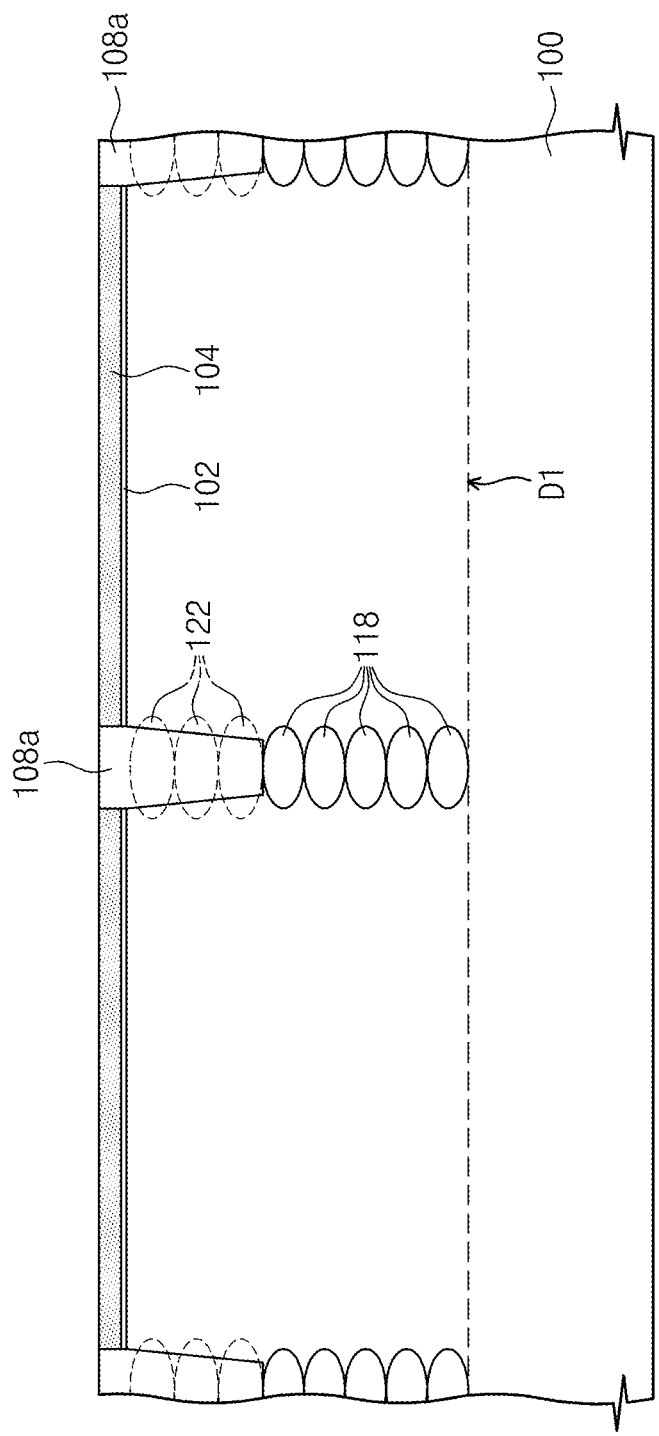

Referring to FIG. 12, the second insulating layer 110 is selectively removed. For example, if the second insulating layer 110 is formed of a silicon nitride layer, the second insulating layer 110 may be removed using a phosphoric acid.

After the second insulating layer 110 is removed, the buried insulating layer 108 on the first insulating layer 104 is removed, for example, by a Chemical Mechanical Polishing (CMP) process to expose the top surface of the first insulating layer 104, and to form device isolation layer 108a having a planar top surface in the trench 106.

In various embodiments, the first and second ion implantation processes 116 and 120 may be performed prior to formation of the device isolation layer 108a in the CMP process to form the first type potential barrier region 118 and the first type sidewall potential barrier region 122, which simplifies the processes. In contrast to forming the first type potential barrier region 118 and the first type sidewall potential barrier region 122 after forming the device isolation layer 108a, the device isolation layer 108a avoids being damaged, e.g., from etching and ion implantation processes.

Figure 13:
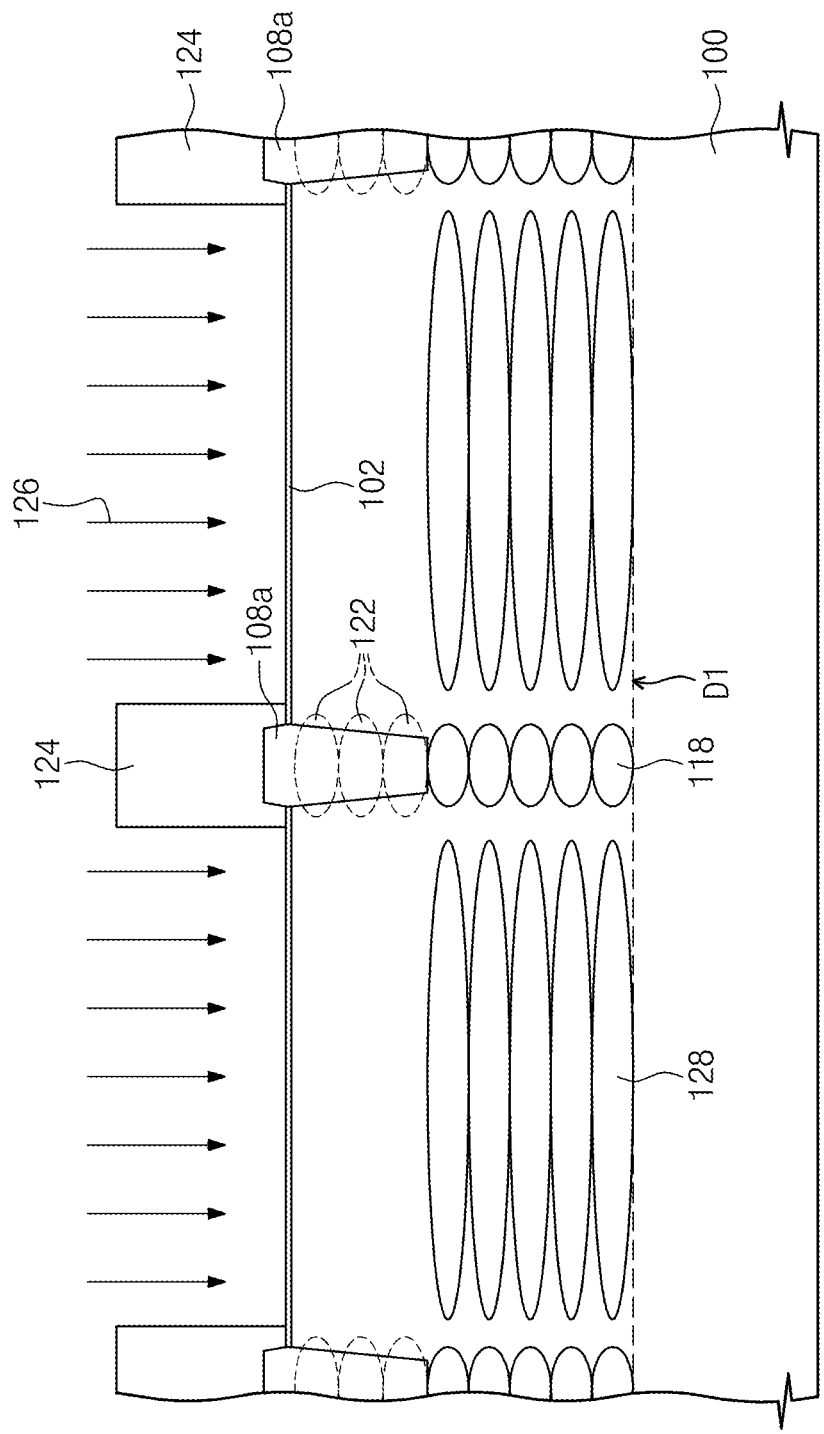

Referring to FIG. 13, the first insulating layer 104 is selectively removed. The first insulating layer 104 may be removed using the same process used to remove the second insulating layer 110, for example. After removing the first insulating layer 104, a second mask pattern 124 is formed over the device isolation layer 108a, while exposing the area in which the photoelectric conversion region PD is to be formed, discussed below. The second mask pattern 124 may be a photoresist pattern or an insulating pattern, for example. A third ion implantation process 126 is performed using the second mask pattern 124 as an ion implantation mask to form the second type well 128 in the semiconductor epitaxial layer 100. The second type well 128 may be formed by injecting phosphorus ions or arsenic ions, for example. The third ion implantation process 126 may be performed multiple times with changing projection range. Therefore, the second type well 128 may be formed to reach the first depth D1. Since phosphorus and arsenic are relatively heavy elements, the third ion implantation process 126 may be performed using lower energy than that used to perform the first ion implantation process 116.

After forming the second type well 128, the second mask pattern 124 is removed. Another ion implantation process may be performed using another mask pattern (not shown) to form the floating diffusion region FD. The transfer gate TG may likewise be formed.

Figure 14:
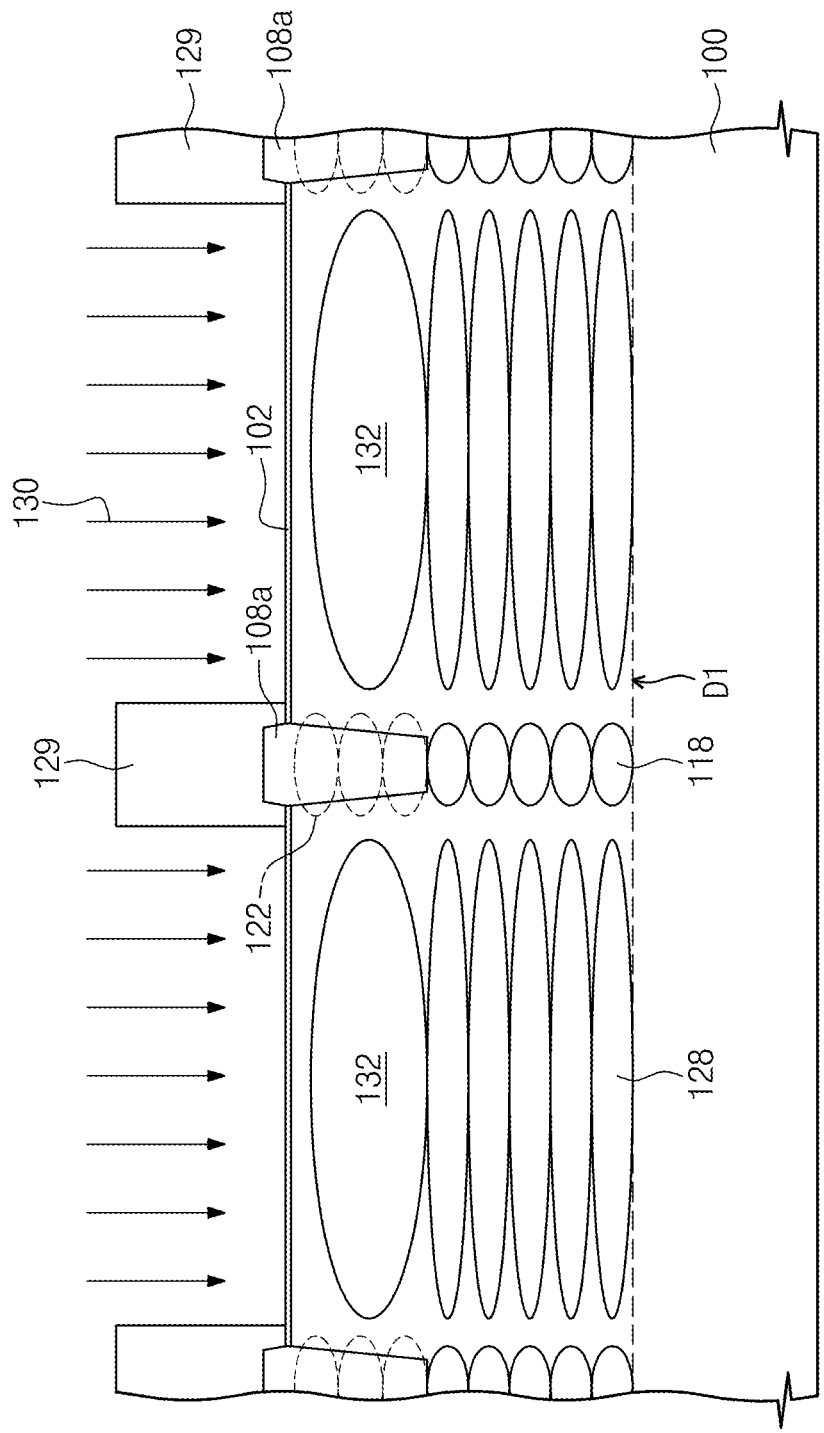

Referring to FIG. 14, a third mask pattern 129 is formed over the floating diffusion region FD, the transfer gate TG, and the device isolation layer 108a, while exposing the area in which the photoelectric conversion region PD is to be formed. The third mask pattern 129 may be a photoresist pattern or an insulating pattern, for example. A fourth ion implantation process 130 is performed using the third mask pattern 129 as an ion implantation mask to form the second type impurity implantation region 132. The fourth ion implantation process 130 may be performed by injecting phosphorus ions or arsenic ions, for example.

Figure 15:
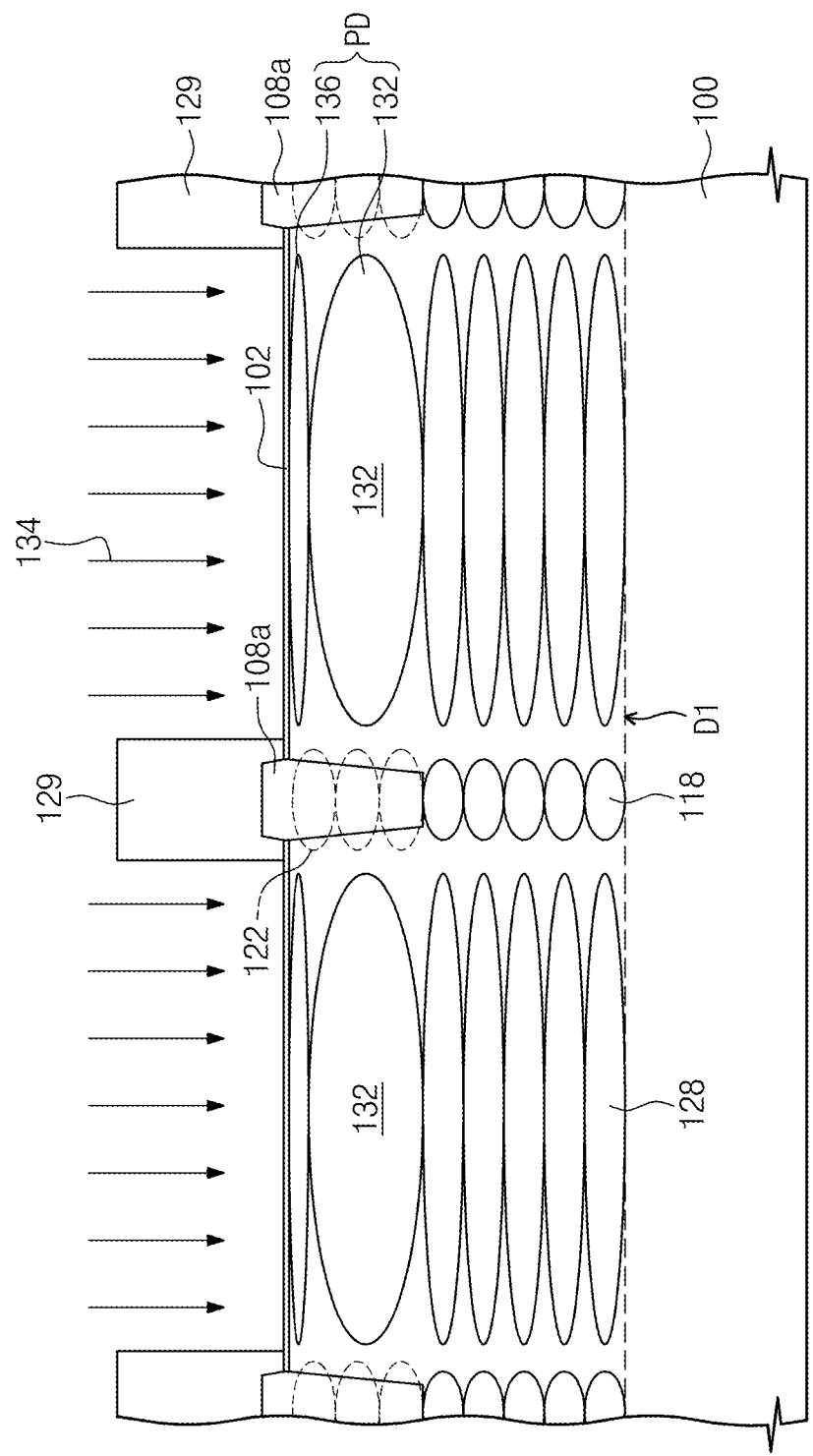

Referring to FIG. 15, after forming the second type impurity implantation region 132, a fifth ion implantation process 134 is performed using the third mask pattern 129 as an ion implantation mask to form the first type impurity implantation region 136. The first type ion implantation region 136 and the second type ion implantation region 132 form the photoelectric conversion region PD. The fifth ion implantation process 134 may be performed by injecting boron ions, for example.

Figure 16:
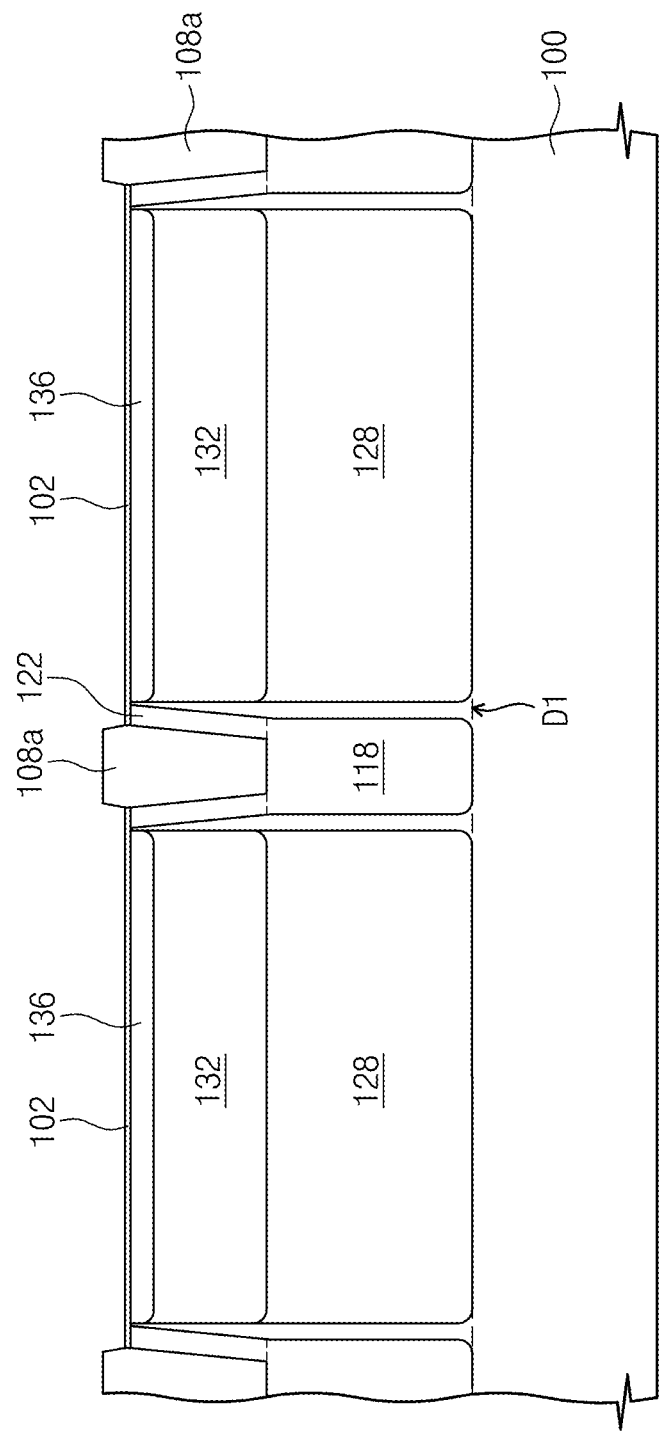

Referring to FIG. 16, the third mask pattern 129 is selectively removed. Subsequently, an annealing process is performed at temperatures in a range from about 600° C. to about 1000° C. to cure lattice damages in the semiconductor epitaxial layer 100 caused by ion implantation processes (e.g., first through fifth ion implantation processes 116, 120, 126, 130 and 134), to re-crystallize an amorphized region and to electrically activate injected dopants.

Figure 17:
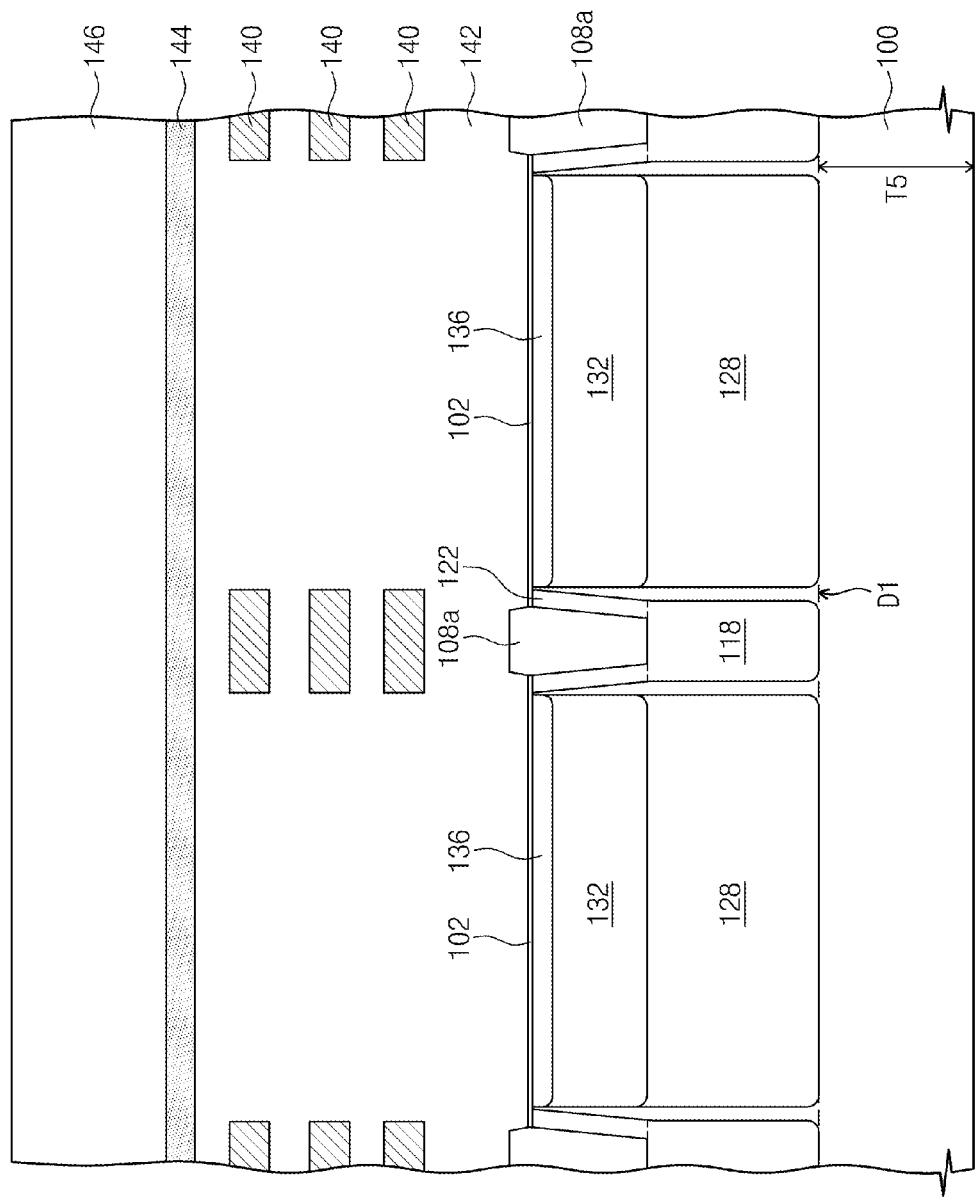

Referring to FIG. 17, the interlayer insulating layer 142 and the interconnection layer 140 are formed. The passivation layer 144 is formed on the interlayer insulating layer 142, and the substrate 146 may be then attached on the passivation layer 144. The bottom portion of the semiconductor epitaxial layer 100 may be removed, by as much as the fifth thickness T5. Referring again to FIG. 3, the color filter 150 and the micro lens 152 may then be formed on the bottom surface of the semiconductor epitaxial layer 100.

Figure 18:
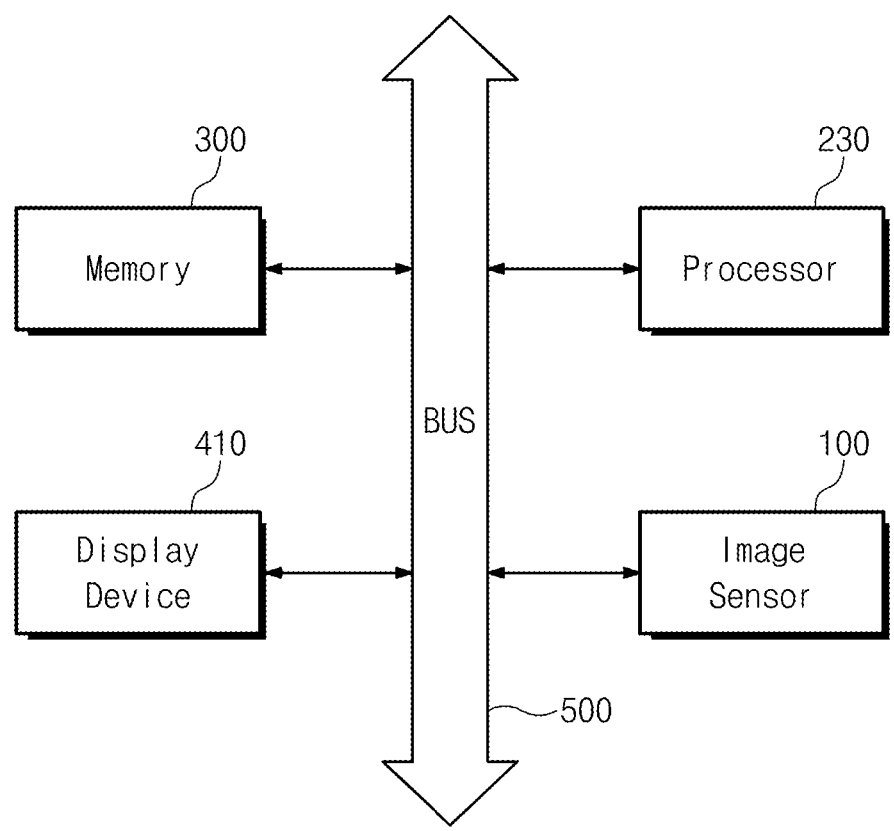
FIG. 18 is a block diagram illustrating an electronic device having an image sensor, according to embodiments of the inventive concept.

FIG. 18 is a block diagram illustrating an electronic device having an image sensor, according to embodiments of the inventive concept. The electronic device may be any of various types of devices, such as a digital camera or a mobile device, for example.

Referring to FIG. 18, an illustrative digital camera system includes an image sensor 100, a processor 230, a memory 300, a display 410 and a bus 500. As shown in FIG. 18, the image sensor 100 captures an external image under control of the processor 230, and provides the corresponding image data to the processor 230 through the bus 500. The processor 230 may store the image data in the memory 300 through the bus 500. The processor 230 may also output the image data stored in the memory 300, e.g., for display on the display device 410.

According to the various embodiments of the inventive concept, an image sensor includes one or more potential barrier regions, which reduce or prevent crosstalk between pixels. Also, according to the various embodiments of the inventive concept, a method for fabricating an image sensor include forming a mask pattern on an insulating layer filling a trench prior to forming a device isolation layer, and performing an ion implantation process using the mask pattern as an ion implantation mask to form a potential barrier region in the bottom of the trench, thereby avoiding damage to the device isolation layer.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A method for fabricating an image sensor, comprising:
    forming a first insulating layer on a semiconductor epitaxial layer having a plurality of pixel regions;
    patterning a portion of the semiconductor epitaxial layer and the first insulating layer in a boundary region between the pixel regions to form a trench;
    forming a buried insulating layer on the first insulating layer, filling the trench, the buried insulating layer having a planar top surface;
    forming a second insulating layer on the buried insulating layer;
    forming a first mask pattern on the second insulating layer, the first mask pattern defining an opening overlapping the trench;
    performing a first ion implantation process using the first mask pattern as a first ion implantation mask to form a first conductivity type of potential barrier region in the semiconductor epitaxial layer beneath the trench;
    widening the opening in the first mask pattern; and
    performing a second ion implantation process using the first mask pattern with the widened opening as a second ion implantation mask to form a first conductivity type of side potential barrier region in the semiconductor epitaxial layer laterally adjacent sides of the trench.

2. The method of claim 1, wherein the first insulating layer and the second insulating layer comprise the same material and have the same thickness.

3. The method of claim 1, wherein an ion implantation angle of the first ion implantation process is about zero degrees.

4. The method of claim 1, further comprising:
removing the first mask pattern;
removing the second insulating layer; and
etching the buried insulating layer to expose a top surface of the first insulating layer and to form a device isolation layer filling the trench.

5. The method of claim 4, further comprising:
forming a second mask pattern over the device isolation layer, exposing each of the pixel regions; and
performing a third ion implantation process using the second mask pattern as a third ion implantation mask to form a second conductivity type of well in the semiconductor epitaxial layer.

6. The method of claim 5, wherein the second conductivity type of well is formed to the same depth as the first conductivity type of potential barrier region.

7. The method of claim 1, further comprising:
removing a lower portion of the semiconductor epitaxial layer,
wherein a depth of the first type potential barrier region corresponds to a thickness of the semiconductor epitaxial layer remaining after removing the lower portion of the semiconductor epitaxial layer.

8. The method of claim 1, wherein the first mask pattern is at least one of a silicon oxide layer and a silicon nitride layer.

9. A method of fabricating an image sensor, comprising:
forming trenches in a semiconductor epitaxial layer in a boundary region between pixel regions in the semiconductor epitaxial layer;
filling the trenches with a buried insulating layer and planarizing a top surface of the buried insulating layer;
forming an insulating layer on the buried insulating layer;
forming a first mask pattern on the insulating layer, the first mask pattern defining openings overlapping the trenches, respectively;
performing a first ion implantation process, of implanting ions of a first conductivity type into the semiconductor epitaxial layer to a first depth, using the first mask pattern as a first ion implantation mask to form the first conductivity type of potential barrier regions in the semiconductor epitaxial layer beneath the trenches;
widening each of the openings in the first mask pattern;
performing a second ion implantation process, of implanting ions of the first conductivity type into the semiconductor epitaxial layer to a depth less than the first depth, using the first mask pattern with the widened openings as a second ion implantation mask to form a respective first conductivity type of side potential barrier region in the semiconductor epitaxial layer adjacent to opposite sides of each of the trenches;
removing the first mask pattern and the insulating layer after the second ion implantation process has been performed;
etching the buried insulating layer to form a device isolation layer filling the trenches; and
forming second conductivity type of wells, to substantially the same depth as the potential barrier regions, in the pixel regions on opposite sides of the potential barrier regions by
forming a second mask pattern covering the device isolation layer and exposing the pixel regions, and
performing a third ion implantation process, of implanting ions of a second conductivity type into the pixel regions of the semiconductor epitaxial layer, using the second mask pattern as an ion implantation mask.

10. The method of claim 9, wherein each of the first and second ion implantation processes, of implanting ions of the first conductivity type, comprises injecting ions of boron at an ion implantation angle of about zero degrees into the semiconductor epitaxial layer.

11. The method of claim 9, wherein the third ion implantation process of implanting ions of the second conductivity type to form the second conductivity type of wells comprises injecting ions of phosphorous or arsenic into the semiconductor epitaxial layer.

12. The method of claim 9, further comprising:
performing another ion implantation process, of implanting ions of the second conductivity type, into the pixel regions of the semiconductor epitaxial layer to form second conductivity type of impurity regions in the semiconductor epitaxial layer in the pixel regions on opposite sides of the trenches,
wherein the ions of the second conductivity type are implanted at a higher concentration and to a lesser depth, in the semiconductor epitaxial layer, to form the second conductivity type of impurity regions than to form the wells; and
performing another ion implantation process, of implanting ions of the first conductivity type, into the pixel regions of the semiconductor epitaxial layer to form first conductivity type of impurity regions in the semiconductor epitaxial layer in the pixel regions on opposite sides of the trenches,
wherein the ions of the first conductivity type are implanted to a lesser depth, in the semiconductor epitaxial layer, to form the first conductivity type of impurity regions than are the ions of the second conductivity type to form the second conductivity type of impurity regions.

13. The method of claim 12, wherein the second conductivity type of impurity regions and the trenches are formed to substantially the same depths.

14. A method of fabricating an image sensor, comprising:
forming trenches in a semiconductor epitaxial layer in a boundary region between pixel regions in the semiconductor epitaxial layer;
filling the trenches with a buried insulating layer and planarizing a top surface of the buried insulating layer;
forming an insulating layer on the buried insulating layer;
forming a first mask pattern on the insulating layer, the first mask pattern defining openings overlapping the trenches, respectively;
removing the first mask pattern and the insulating layer;
etching the buried insulating layer to form a device isolation layer filling the trenches; and
forming first conductivity type of potential barrier regions in the semiconductor epitaxial layer beneath the trenches, respectively, and forming second conductivity type of wells to substantially the same depth as the potential barrier regions in the pixel regions on opposite sides of the potential barrier regions,
wherein the forming of the potential barrier regions and the wells to the same depths comprises:
performing a first ion implantation process, of implanting ions of a first conductivity type into the semiconductor epitaxial layer to a first depth, using the first mask pattern as a first ion implantation mask to form the first conductivity type of potential barrier regions in the semiconductor epitaxial layer beneath the trenches, forming a second mask pattern covering the device isolation layer and exposing the pixel regions, and performing a second ion implantation process, of implanting ions of a second conductivity type into the pixel regions of the semiconductor epitaxial layer, using the second mask pattern as an ion implantation mask; and removing a bottom portion of the semiconductor epitaxial layer until portions of the first conductivity type of potential barrier regions and the second conductivity type of wells are exposed.

* * * * *